United States Patent
Hoshino et al.

(10) Patent No.: US 6,850,752 B2
(45) Date of Patent: Feb. 1, 2005

(54) SINGLE-TO-DIFFERENTIAL CONVERSION CIRCUIT OUTPUTTING DC-BALANCED DIFFERENTIAL SIGNAL

(75) Inventors: Wakako Hoshino, Kawasaki (JP); Noriaki Shirai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 402 days.

(21) Appl. No.: 10/084,151

(22) Filed: Feb. 28, 2002

(65) Prior Publication Data

US 2002/0146998 A1 Oct. 10, 2002

(30) Foreign Application Priority Data

Apr. 5, 2001 (JP) ........................................ 2001-107533

(51) Int. Cl.[7] .............................................. H04B 1/28
(52) U.S. Cl. ...................... 455/333; 455/281; 455/286
(58) Field of Search ................................ 455/333, 338, 455/323, 90.1, 90.2, 127.3, 132, 133, 214, 251.1, 253.1, 273, 281, 286, 290

(56) References Cited

U.S. PATENT DOCUMENTS

| | | | |
|---|---|---|---|
| 5,826,182 A | 10/1998 | Gilbert | ........................ 455/326 |
| 6,122,497 A | 9/2000 | Gilbert | ........................ 455/333 |

Primary Examiner—Tony T. Nguyen
(74) Attorney, Agent, or Firm—Arent Fox PLLC

(57) ABSTRACT

In a single-to-differential conversion circuit for converting a single signal into a differential signal formed of first and second signal components: a source-grounded (or emitter-grounded) first transistor receives the single signal at the drain (or collector); the gate (or base) and drain (or collector) of the first transistor are connected; the gate (or base) of a source-grounded (or emitter-grounded) second transistor is connected to the gate (or base) of the first transistor; the drain (or collector) of a gate-grounded (or base-grounded) third transistor outputs the first signal component; the source (or emitter) of the third transistor is connected to the drain (or collector) of the first transistor; the drain (or collector) of a gate-grounded (or base-grounded) fourth transistor outputs the second signal component; and the source (or emitter) of the fourth transistor is connected to the drain (or collector) of the second transistor.

4 Claims, 11 Drawing Sheets

US 6,850,752 B2

SINGLE-TO-DIFFERENTIAL CONVERSION CIRCUIT OUTPUTTING DC-BALANCED DIFFERENTIAL SIGNAL

BACKGROUND OF THE INVENTION

1) Field of the Invention

The present invention relates to a single-to-differential conversion circuit which converts a single signal to a differential signal.

2) Description of the Related Art

Generally, the high frequency circuits realizing receivers in the field of communications such as mobile communications comprise a mixer, a low noise amplifier (LNA), a filter and the like. Most of the LNAs and filters are arranged to have a single output and input and output impedances of 50 or 75 ohms. However, in most cases, the mixers are double balanced mixers since the double balanced mixers are resistant to even order harmonic distortions and leakage of LO (local oscillator) signals. Therefore, the single-to-differential conversion is necessary.

FIG. 9 is a diagram illustrating a first example of conventional single-to-differential conversion circuits. The single-to-differential conversion circuit of FIG. 9 comprises MOS-FETs (metal-oxide semiconductor field effect transistors) 10 and 11, and a constant current source 12.

As illustrated in FIG. 9, an input signal is applied to the gate terminal of the MOS-FET 10. When the gate-source voltage of the MOS-FET 10 varies with the input signal, the output signal OUT+ of the MOS-FET 10 varies with the gate-source voltage of the MOS-FET 10. Since the source terminal of the MOS-FET 10 is connected to the constant current source 12 and the source terminal of the MOS-FET 11, the sum of the source currents output from the MOS-FETs 10 and 11 is constant.

Therefore, when the output signal OUT+ from the MOS-FET 10 increases, the output signal OUT− from the MOS-FET 11 decreases by the same amount as the amount of the increase in the output signal OUT+ from the MOS-FET 10. Conversely, when the output signal OUT+ from the MOS-FET 10 decreases, the output signal OUT− from the MOS-FET 11 increases by the same amount as the amount of the decrease in the output signal OUT+ from the MOS-FET 10. That is, the input signal applied to the gate terminal of the MOS-FET 10 is converted into a differential signal comprised of the output signals OUT+ and OUT−, where the difference in the phase between the output signals OUT+ and OUT− is $\pi$.

However, in the single-to-differential conversion circuit of FIG. 9, the signal propagation paths from the signal input point to the current determination points are different. Therefore, the phase difference between the output signal OUT+ from the MOS-FET 10 and the output signal OUT− from the MOS-FET 11 deviates from $\pi$.

In addition, since the input impedance of the gate terminal is high, it is necessary to provide a matching circuit in the stage preceding the gate terminal of the MOS-FET 10 when the single-to-differential conversion circuit is used in a 50-ohm system. However, when the matching circuit is provided in the stage preceding the gate terminal of the MOS-FET 10, the matching circuit has frequency selectivity. Therefore, it is difficult to use the single-to-differential conversion circuit of FIG. 9 in a system in which a wide bandwidth is required.

In order to solve the above problem, Barrie Gilbert, the inventor of the Gilbert Cell, proposed a single-to-differential conversion circuit as illustrated in FIG. 10, which is a diagram illustrating the single-to-differential conversion circuit as a second example of the conventional single-to-differential conversion circuits.

The single-to-differential conversion circuit of FIG. 10 is constituted by NPN transistors 20 to 22. When the NPN transistors 20 to 22 are replaced with MOS-FETs, the single-to-differential conversion circuit of FIG. 11 is obtained. Thus, the single-to-differential conversion circuit of FIG. 11 comprises MOS-FETs 30 to 32.

In the MOS-FET 30, the source terminal is grounded, the drain terminal and the gate terminal are connected, and an input signal of the single-to-differential conversion circuit of FIG. 11 is applied to the drain terminal of the MOS-FET 30. The source terminal of the MOS-FET 31 is grounded, the gate terminals of the MOS-FETs 30 and 31 are connected, and an output signal OUT− is obtained from the drain terminal of the MOS-FET 31. The MOS-FETs 30 and 31 constitute a current mirror circuit. The gate terminal of the MOS-FET 32 is grounded, the source terminal of the MOS-FET 32 is connected to the drain terminal of the MOS-FET 30, and another output signal OUT+ is obtained from the drain terminal of the MOS-FET 32.

The operations of the single-to-differential conversion circuit of FIG. 11 are explained below.

When an input signal is supplied to the single-to-differential conversion circuit of FIG. 11, currents having opposite phases flow in the MOS-FETs 30 and 32, respectively. That is, when the input signal is increased, the gate and drain voltages of the MOS-FET 30 are raised, and therefore the drain current of the MOS-FET 30 increases. On the other hand, in this case, the source voltage of the MOS-FET 32 is raised, and therefore the drain current of the MOS-FET 32 decreases.

Since the MOS-FET 30 and the MOS-FET 31 constitute a current mirror circuit, the drain currents of the MOS-FETs 30 and 31 are equalized. Therefore, the phases of the drain current of the MOS-FET 32 as the output signal OUT+ and the drain current of the MOS-FET 31 as the output signal OUT− become opposite. Thus, the single input signal is converted into a differential signal constituted by the above output signals OUT+ and OUT−.

The accuracy of the oppositeness in the output signals OUT+ and OUT− in the single-to-differential conversion circuit of FIG. 11 is higher than that of FIG. 9. In addition, since the input signal is applied to the source terminal of the MOS-FET 32, the input impedance is low. Therefore, the matching circuit is unnecessary, and the frequency characteristics are satisfactory.

However, since the numbers of the MOS-FETs vertically connected on the OUT+ and OUT− sides of the single-to-differential conversion circuit of FIG. 11 are different, the operating points of the MOS-FETs 30 and 31 become different. Therefore, the DC currents are unbalanced.

In addition, for example, when the single-to-differential conversion circuit of FIG. 11 is used as an RF (radio frequency) signal input circuit in a double-balanced mixer, the switching conditions of the MOS-FETs on the OUT+ and OUT− sides of the single-to-differential conversion circuit of FIG. 11 in response to an LO (local oscillator) signal become different since the DC current levels on the OUT+ and OUT− sides of the single-to-differential conversion circuit of FIG. 11 are different. Therefore, signal distortion and LO-signal leakage are likely to occur in the double-balanced mixer.

SUMMARY OF THE INVENTION

An object of the present invention is to provide a single-to-differential conversion circuit which has a low input impedance and non-inverted and inverted outputs which are well balanced in their DC current levels.

(1) According to the first aspect of the present invention, there is provided a single-to-differential conversion circuit for converting a single signal into a differential signal comprised of first and second signal components. The single-to-differential conversion circuit comprises: a first transistor which has a first drain terminal, a first gate terminal connected to the first drain terminal, and a grounded first source terminal, and receives the single signal at the first drain terminal; a second transistor which has a second drain terminal, a second gate terminal connected to the first gate terminal, and a grounded second source terminal; a third transistor which has a third drain terminal, a grounded third gate terminal, and a third source terminal connected to the first drain terminal, and outputs the first signal component from the third drain terminal; and a fourth transistor which has a fourth drain terminal, a grounded fourth gate terminal, and a fourth source terminal connected to the second drain terminal, and outputs the second signal component from the fourth drain terminal.

The single-to-differential conversion circuit according to the first aspect of the present invention may have the following additional feature (i).

(i) The third drain terminal is connected to a power supply through a first resistor, the fourth drain terminal is connected to the power supply through a second resistor, the first signal component is a voltage signal which is generated by conversion from a current flowing into the third drain terminal, and the second signal component is a voltage signal which is generated by conversion from a current flowing into the fourth drain terminal.

(2) According to the second aspect of the present invention, there is provided a single-to-differential conversion circuit for converting a single signal into a differential signal comprised of first and second signal components. The single-to-differential conversion circuit comprises: a first transistor which has a first collector terminal, a first base terminal connected to the first collector terminal, and a grounded first emitter terminal, and receives the single signal at the first collector terminal; a second transistor which has a second collector terminal, a second base terminal connected to the first base terminal, and a grounded second emitter terminal; a third transistor which has a third collector terminal, a grounded third base terminal, and a third emitter terminal connected to the first collector terminal, and outputs the first signal component from the third collector terminal; and a fourth transistor which has a fourth collector terminal, a grounded fourth base terminal, and a fourth emitter terminal connected to the second collector terminal, and outputs the second signal component from the fourth collector terminal.

The single-to-differential conversion circuit according to the second aspect of the present invention may have the following additional feature (ii).

(ii) In the single-to-differential conversion circuit according to the second aspect of the present invention, wherein the third collector terminal is connected to a power supply through a first resistor, the fourth collector terminal is connected to the power supply through a second resistor, the first signal component is a voltage signal which is generated by conversion from a current flowing into the third collector terminal, and the second signal component is a voltage signal which is generated by conversion from a current flowing into the fourth collector terminal.

(3) In the single-to-differential conversion circuit according to the present invention, the grounding may be either DC grounding or AC grounding. According to the first and second aspects of the present invention, the balance between the DC components included in the first and second signal components of the differential signal can be improved. Therefore, for example, when the single-to-differential conversion circuit according to the first or second aspect of the present invention is used in a mixer, the distortion characteristics of the mixer can be improved.

The above and other objects, features and advantages of the present invention will become apparent from the following description when taken in conjunction with the accompanying drawings which illustrate preferred embodiment of the present invention by way of example.

DESCRIPTION OF THE PREFERRED EMBODIMENTS

Embodiments of the present invention are explained in detail below with reference to drawings.

(1) First Embodiment

Figure 1:
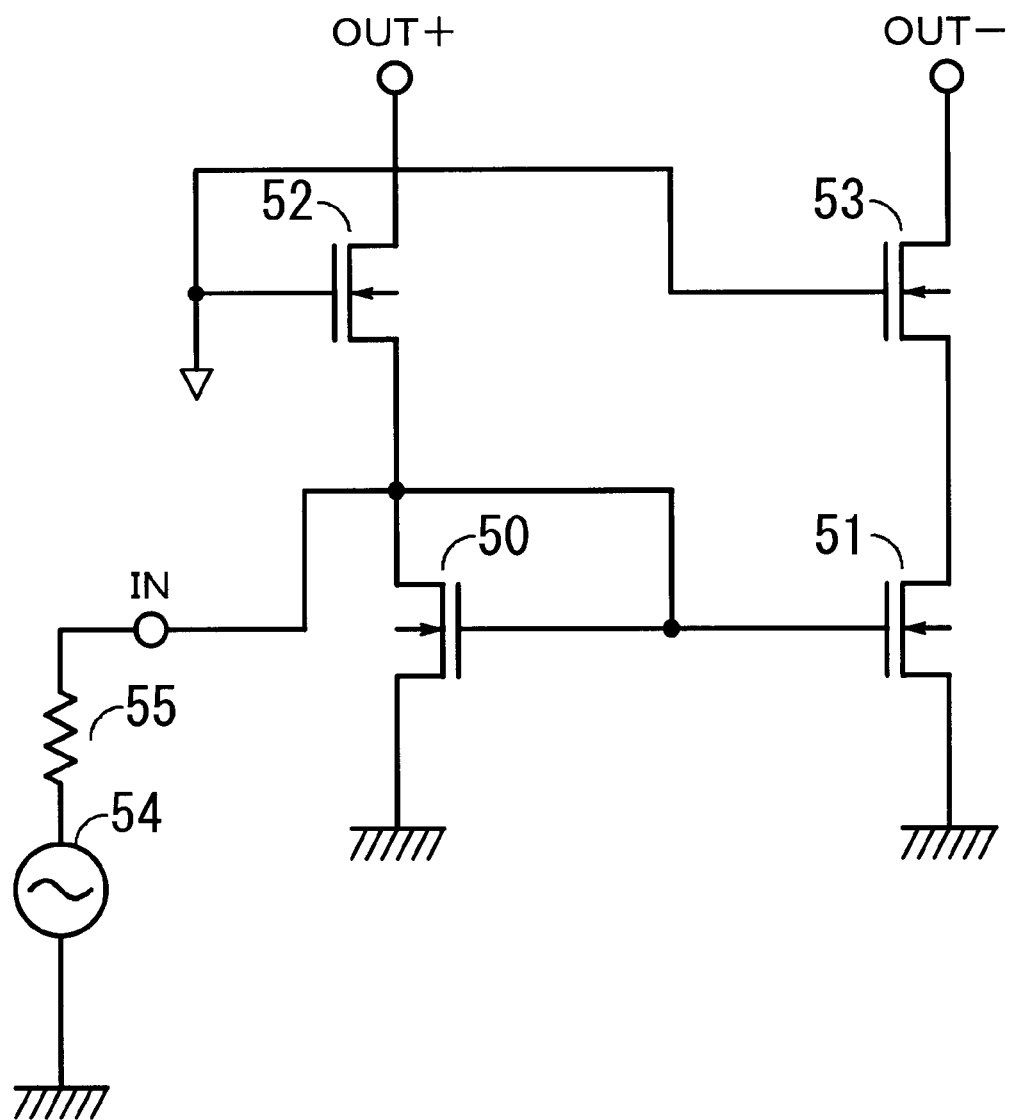
FIG. 1 is a diagram illustrating a construction of a single-to-differential conversion circuit as a first embodiment of the present invention.

FIG. 1 is a diagram illustrating a construction of a single-to-differential conversion circuit as a first embodiment of the present invention. The single-to-differential conversion circuit of FIG. 1 comprises MOS-FETs 50 to 53. In addition, a signal source 54 is connected to the input terminal of the single-to-differential conversion circuit of FIG. 1 through a resistor 55.

In the MOS-FET 50, the source terminal is grounded, the drain and gate terminals are connected, and an input signal of the single-to-differential conversion circuit of FIG. 1 is applied to the drain terminal. The source terminal of the MOS-FET 51 is grounded, the gate terminals of the MOS-FETs 51 and 50 are connected, and the drain terminal of the MOS-FET 51 is connected to the source terminal of the MOS-FET 53. The gate terminal of the MOS-FET 52 is grounded, the source terminal of the MOS-FET 52 is connected to the drain terminal of the MOS-FET 50, and an output signal OUT+ of the single-to-differential conversion circuit of FIG. 1 is obtained from the drain terminal of the MOS-FET 52. The gate terminal of the MOS-FET 53 is grounded, the source terminal of the MOS-FET 53 is connected to the drain terminal of the MOS-FET 51, and another output signal OUT− of the single-to-differential conversion circuit of FIG. 1 is obtained from the drain terminal of the MOS-FET 53.

In addition, the signal source 54 is connected to the connection point of the drain terminal of the MOS-FET 50 and the source terminal of the MOS-FET 52 through the resistor 55. That is, the input terminal of the single-to-differential conversion circuit of FIG. 1 is located at the connection point of the drain terminal of the MOS-FET 50 and the source terminal of the MOS-FET 52.

The operations of the single-to-differential conversion circuit of FIG. 1 are explained below.

When a signal voltage is supplied from the signal source 54 to the input terminal of the single-to-differential conversion circuit of FIG. 1, a first drain current flows into the MOS-FET 50 according to the voltage applied to the MOS-FET 50. On the other hand, a second drain current having a phase opposite to the phase of the first drain current flows into the MOS-FET 52, and corresponds to the output signal OUT+.

Since the MOS-FETs 50 and 51 constitute a current mirror circuit, the amount of the current flowing into the drain terminal of the MOS-FET 50 is identical to the amount of the current flowing into the drain terminal of the MOS-FET 51. In addition, the amount of the current flowing into the drain terminal of the MOS-FET 53 is identical to the amount of the current flowing into the drain terminal of the MOS-FET 51, and the current flowing into the drain terminal of the MOS-FET 53 corresponds to the output signal OUT−.

Further, since the voltage applied to the drain terminal of the MOS-FET 53 is divided into the source-drain voltages of the MOS-FET 53 and the MOS-FET 51, the source-drain voltage of the MOS-FET 51 is close to the source-drain voltage of the MOS-FET 50. Therefore, the operating point of the MOS-FET 51 is close to the operating point of the MOS-FET 50, and the DC current levels on the OUT+ and OUT− sides of the single-to-differential conversion circuit of FIG. 1 are equalized.

Figure 11:
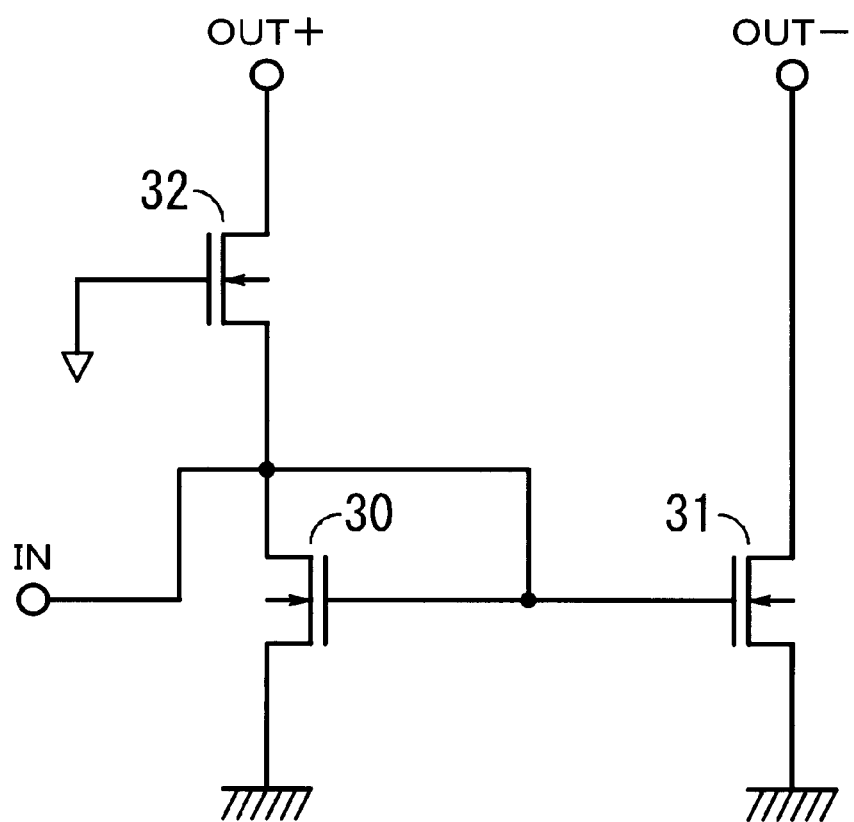
FIG. 11 is a diagram illustrating a third example of the conventional single-to-differential conversion circuits.

Simulation results of the single-to-differential conversion circuits of FIGS. 11 and 1 are compared below.

Figure 2:
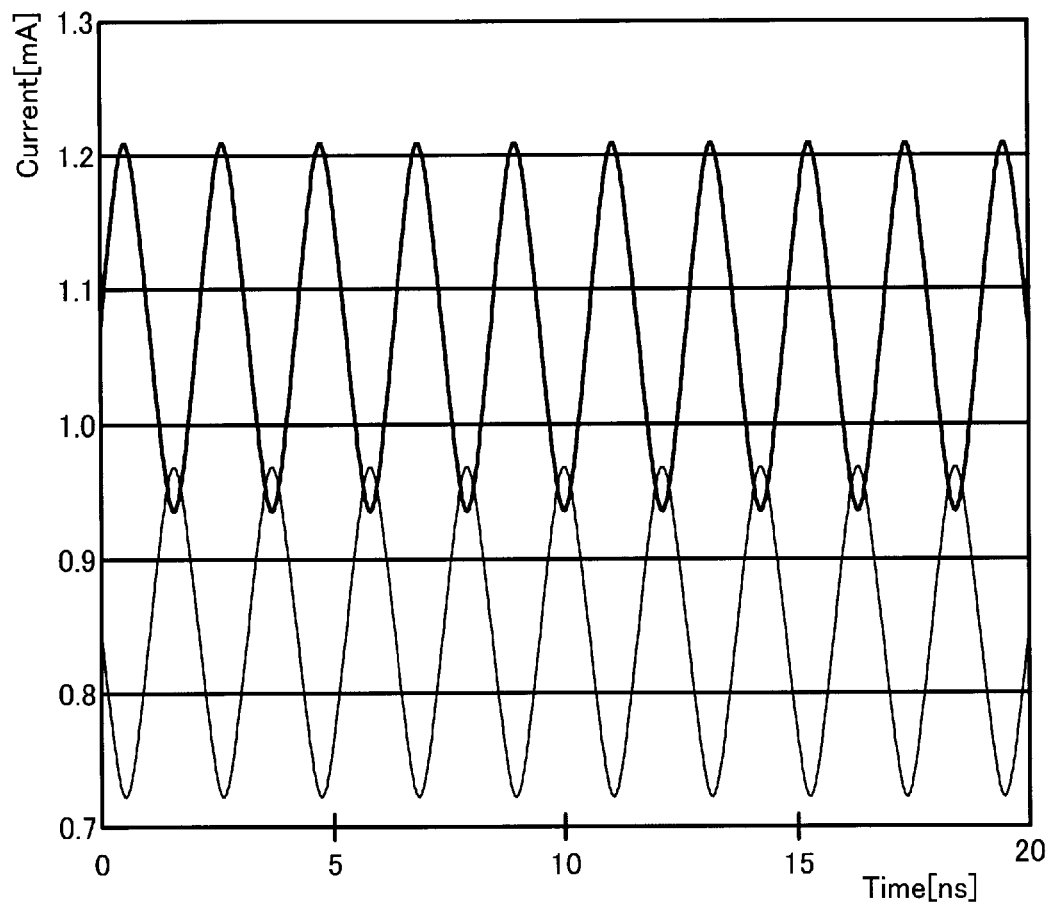
FIG. 2 is a diagram indicating a result of a simulation of the conventional single-to-differential conversion circuit of FIG. 11.

FIG. 2 is a diagram indicating a result of a simulation of the conventional single-to-differential conversion circuit of FIG. 11. In FIG. 2, the abscissa corresponds to the current, the ordinate corresponds to the time, the thinner curve indicates the drain current of the MOS-FET 32, and the thicker curve indicates the drain current of the MOS-FET 31.

As indicated in FIG. 2, the average level (DC current level) of the drain current of the MOS-FET 31 is higher than the average level (DC current level) of the drain current of the MOS-FET 32. In addition, FIG. 2 indicates that the amplitude of the drain current of the MOS-FET 31 is greater than the amplitude of the drain current of the MOS-FET 32. This is because the operating points of the MOS-FETs 32 and 31 are different.

As indicated above, in the conventional single-to-differential conversion circuit, the DC current levels and amplitudes of the non-inverted and inverted output currents are different.

Figure 3:
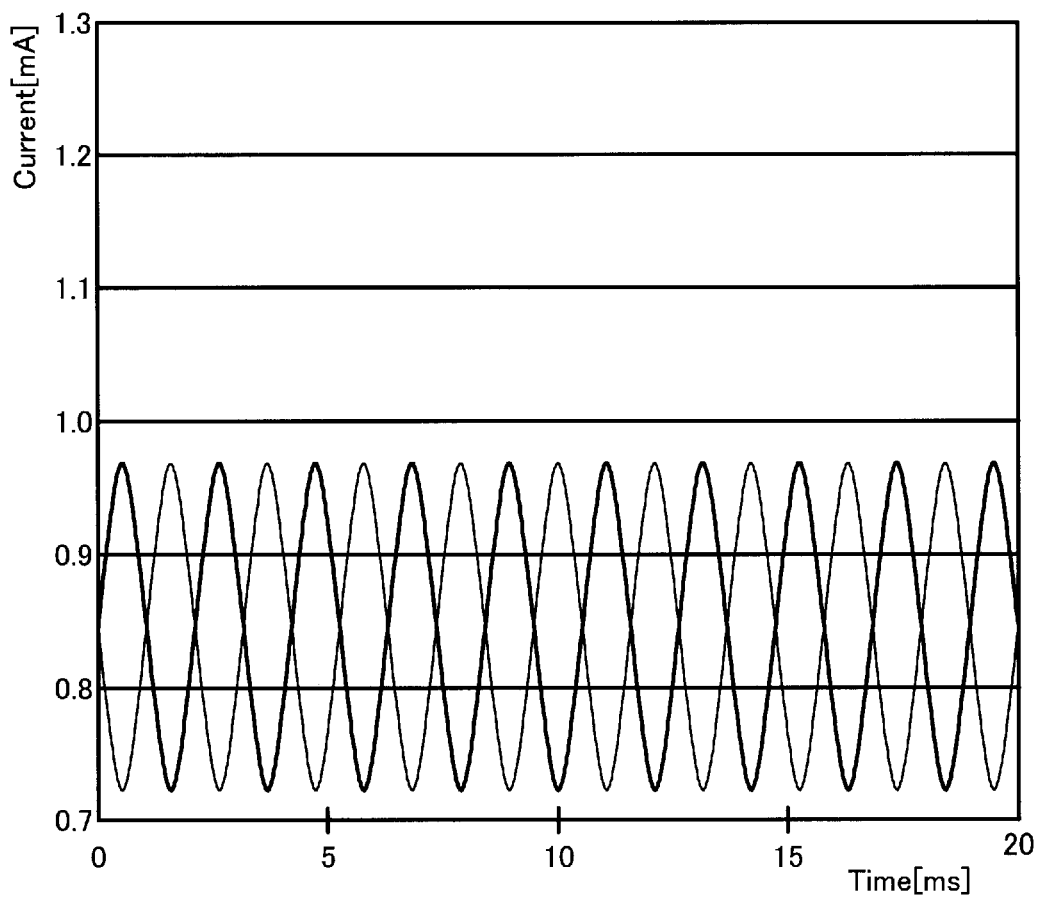
FIG. 3 is a diagram indicating a result of a simulation of the single-to-differential conversion circuit of FIG. 1.

FIG. 3 is a diagram indicating a result of a simulation of the single-to-differential conversion circuit of FIG. 1. In FIG. 2, the abscissa corresponds to the current, the ordinate corresponds to the time, the thinner curve indicates the drain current of the MOS-FET 52, and the thicker curve indicates the drain current of the MOS-FET 53.

As indicated in FIG. 3, the average level (DC current level) and amplitude of the drain current of the MOS-FET 52 is approximately coincide with the average level (DC current level) and amplitude of the drain current of the MOS-FET 53, respectively. That is, the DC current levels and amplitudes of the non-inverted and inverted output currents coincide with high accuracy.

Although the N-channel MOS-FETs are used in the single-to-differential conversion circuit of FIG. 1, a similar single-to-differential conversion circuit can be constituted by using P-channel MOS-FETs.

(2) Use of First Embodiment

An example of application of the single-to-differential conversion circuit of FIG. 1 to a receiver circuit used in the field of mobile communications is explained below.

Figure 4:
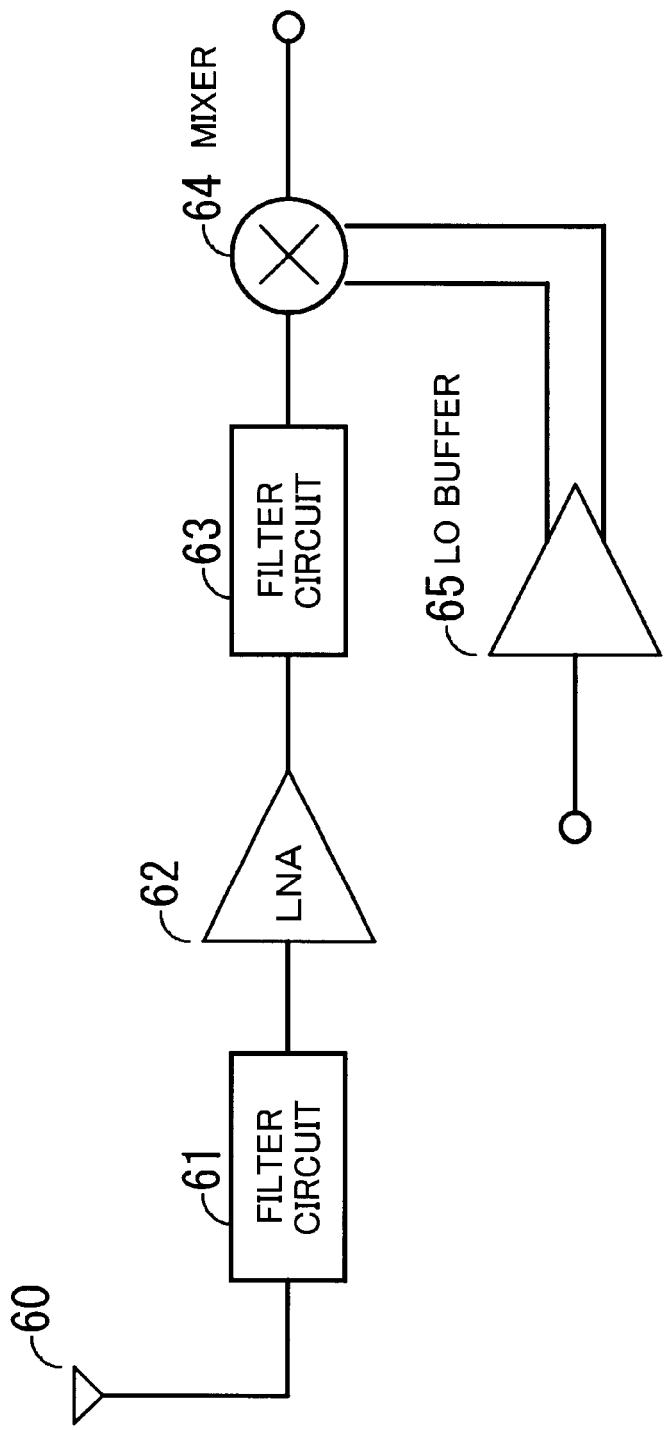
FIG. 4 is a diagram illustrating an outline of an example of a receiver circuit used in the field of mobile communications.

FIG. 4 is a diagram illustrating an outline of an example of a receiver circuit used in the field of mobile communications. The receiver circuit of FIG. 4 comprises an antenna 60, filter circuits 61 and 63, an LNA (low noise amplifier) 62, a mixer 64, and an LO buffer 65.

The antenna 60 receives an electromagnetic wave transmitted from a base station (not shown). The filter circuits 61 and 63 extract a component of the received electromagnetic wave having a predetermined frequency. The LNA 62 amplifies the output of the filter circuit 61 with a predetermined gain, and supplies the amplified output to the filter circuit 63. The mixer 64 multiplies the output of the filter circuit 63 (which is hereinafter referred to as an RF signal) by an LO (local oscillator) signal, and outputs an IF (intermediate-frequency) signal, where the LO signal is output from the LO buffer 65 in a differential form. The LO buffer 65 receives a single local oscillator signal, generates the LO signal in the differential form comprised of components LO+ and LO−, and outputs the differential LO signal to the mixer 64.

Figure 5:
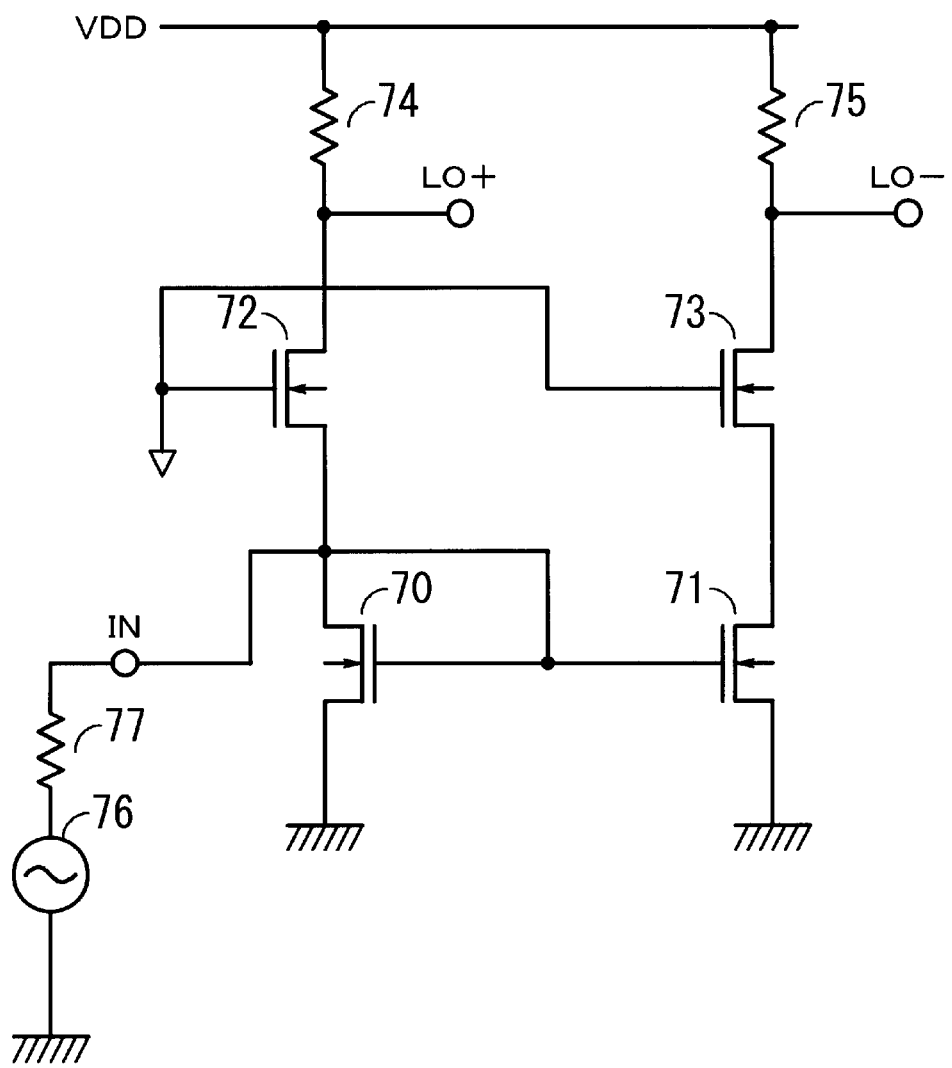
FIG. 5 is a diagram illustrating details of an example of the LO buffer 65 in the construction of FIG. 4.

FIG. 5 is a diagram illustrating details of an example of the LO buffer 65 in the construction of FIG. 4. As illustrated in FIG. 5, the LO buffer 65 comprises MOS-FETs 70 to 73 and resistors 74 and 75. In addition, a local signal source 76 is connected to the input terminal of the LO buffer 65 through a resistor 77.

In the MOS-FET 70, the source terminal is grounded, the drain and gate terminals are connected, and an input signal of the single-to-differential conversion circuit of FIG. 1 is applied to the drain terminal. The source terminal of the MOS-FET 71 is grounded, the gate terminals of the MOS-FETs 71 and 70 are connected, and the drain terminal of the MOS-FET 71 is connected to the source terminal of the MOS-FET 73. The gate terminal of the MOS-FET 72 is grounded, and the source terminal of the MOS-FET 72 is connected to the drain terminal of the MOS-FET 70. In addition, the drain terminal of the MOS-FET 72 is connected to a power supply VDD through the resistor 74, and the LO+ signal as an output signal of the LO buffer 65 is obtained from the connection point of the resistor 74 and the MOS-FET 72. The gate terminal of the MOS-FET 73 is grounded, and the source terminal of the MOS-FET 73 is connected to the drain terminal of the MOS-FET 71. In addition, the drain terminal of the MOS-FET 73 is connected to the power supply VDD through the resistor 75, and the LO− signal as another output signal of the LO buffer 65 is obtained from the connection point of the resistor 75 and the MOS-FET 73.

Figure 6:
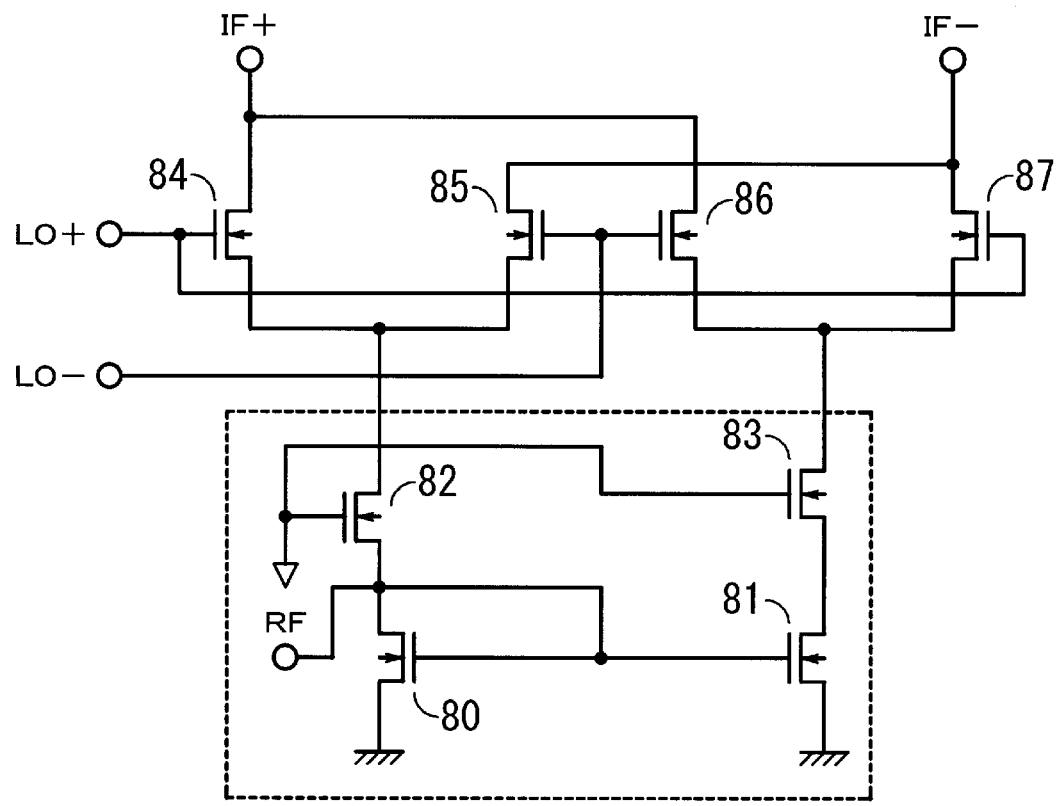
FIG. 6 is a diagram illustrating details of an example of the mixer 64 in the construction of FIG. 4.

FIG. 6 is a diagram illustrating details of an example of the mixer 64 in the construction of FIG. 4. As illustrated in FIG. 6, the mixer 64 comprises MOS-FETs 80 to 87.

In the MOS-FET 80, the source terminal is grounded, the drain and gate terminals are connected, and the RF signal output from the filter circuit 63 is supplied to the drain terminal of the MOS-FET 80. The source terminal of the MOS-FET 81 is grounded, the gate terminals of the MOS-FETs 81 and 80 are connected, and the drain terminal of the MOS-FET 81 is connected to the source terminal of the MOS-FET 83. The gate terminal of the MOS-FET 82 is grounded, the source terminal of the MOS-FET 82 is connected to the drain terminal of the MOS-FET 80, and the drain terminal of the MOS-FET 82 is connected to the source terminals of the MOS-FETs 84 and 85. The gate terminal of the MOS-FET 83 is grounded, the source terminal of the MOS-FET 83 is connected to the drain terminal of the MOS-FET 81, and the drain terminal of the MOS-FET 83 is connected to the source terminals of the MOS-FETs 86 and 87. Thus, the MOS-FETs 80 to 83 constitute a single-to-differential conversion circuit, which is encircled by the dashed rectangular box in FIG. 6.

The MOS-FETs 84 and 85 constitute a differential amplifier. The source terminal of the MOS-FET 84 is connected to the source terminal of the MOS-FET 85 and the drain terminal of the MOS-FET 82. An intermediate-frequency signal IF+ is obtained from the drain terminal of the MOS-FET 84, which is connected to the drain terminal of the MOS-FET 86. The LO+ signal output from the LO buffer 65 is applied to the gate terminal of the MOS-FET 84, which is connected to the gate terminal of the MOS-FET 87.

The source terminal of the MOS-FET 85 is connected to the source terminal of the MOS-FET 84 and the drain terminal of the MOS-FET 82. The drain terminal of the MOS-FET 85 is connected to the drain terminal of the MOS-FET 87. The LO– signal output from the LO buffer 65 is applied to the gate terminal of the MOS-FET 85, which is connected to the gate terminal of the MOS-FET 86.

The MOS-FETs 86 and 87 constitute another differential amplifier. The source terminal of the MOS-FET 86 is connected to the source terminal of the MOS-FET 87 and the drain terminal of the MOS-FET 83. The drain terminal of the MOS-FET 86 is connected to the drain terminal of the MOS-FET 84. The LO– signal output from the LO buffer 65 is applied to the gate terminal of the MOS-FET 86, which is connected to the gate terminal of the MOS-FET 85.

The source terminal of the MOS-FET 87 is connected to the source terminal of the MOS-FET 86 and the drain terminal of the MOS-FET 83. An intermediate-frequency signal IF– is obtained from the drain terminal of the MOS-FET 87, which is connected to the drain terminal of the MOS-FET 85. The LO+ signal output from the LO buffer 65 is applied to the gate terminal of the MOS-FET 87, which is connected to the gate terminal of the MOS-FET 84.

The operations of the receiver circuit of FIG. 4 including the LO buffer 65 and the mixer 64 are explained below.

A component, having a predetermined frequency, of the electromagnetic wave transmitted from the base station and received by the antenna 60 is selected by the filter circuit 61, and supplied to the LNA 62. The LNA 62 amplifies the output of the filter circuit 61 with a predetermined gain. The filter circuit 63 selects only a component, having the above predetermined frequency, of the output of the LNA 62.

The LO buffer 65 receives the single local oscillator signal output from the local signal source 76, at the drain terminal of the MOS-FET 70. Currents having opposite phases flow in the MOS-FETs 70 and 72, respectively, and a voltage corresponding to the drain current flowing into the MOS-FET 72 is generated in the resistor 74.

Since the MOS-FETs 70 and 71 constitute a current mirror circuit, the amount of the current flowing into the drain terminal of the MOS-FET 70 is identical to the amount of the current flowing into the drain terminal of the MOS-FET 71. In addition, the amount of the current flowing into the drain terminal of the MOS-FET 73 is identical to the amount of the current flowing into the drain terminal of the MOS-FET 71. Therefore, a voltage corresponding to the drain current flowing in the MOS-FET 73 is generated in the resistor 75.

Since the phase of the drain current of the MOS-FET 72 is opposite to the phase of the drain current of the MOS-FET 73, the LO+ and LO– signals has opposite phases. The LO+ signal generated as above is supplied to the MOS-FETs 84 and 87, and the LO– signal generated as above is supplied to the MOS-FETs 85 and 86.

In the mixer 64, the RF signal output from the filter circuit 63 is converted into a differential signal by the single-to-differential conversion circuit constituted by the MOS-FETs 80 to 83. Thus, the source current of the differential amplifier constituted by the MOS-FETs 84 and 85 and the source current of the differential amplifier constituted by the MOS-FETs 86 and 87 each vary with the RF signal, where the phases of the variations in the source currents are opposite.

Since the LO+ and LO– signals are supplied to the non-inverted and inverted input terminals of the above differential amplifiers, the mixer 64 of FIG. 4 outputs as the IF+ and IF– signals a result of multiplication of the LO signal and the RF signal.

The DC current levels of the LO+ and LO– signals generated by the LO buffer 65 are well balanced, and the DC current levels in the single-to-differential conversion circuit in the mixer 64 are also well balanced. Therefore, distortions of the IF+ and IF– signals are small. In addition, the leakage of the LO signal is reduced, although the leakage of the LO signal occurs when the output of the single-to-differential conversion circuit includes unbalanced DC components.

(3) Second Embodiment

Figure 7:
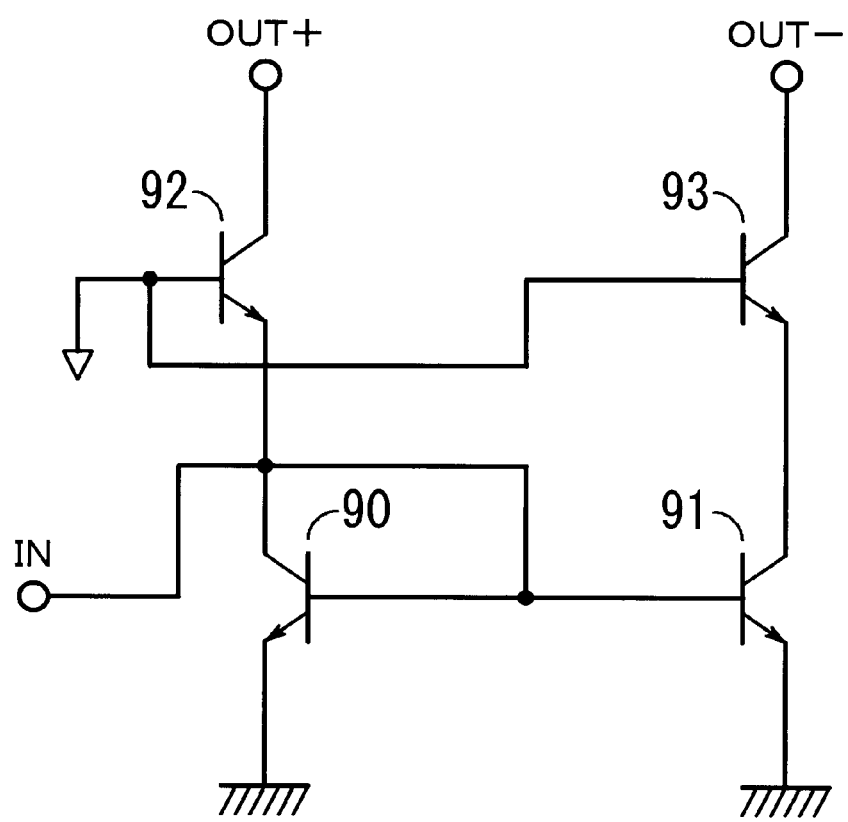
FIG. 7 is a diagram illustrating a construction of a single-to-differential conversion circuit as a second embodiment of the present invention.

FIG. 7 is a diagram illustrating a construction of a single-to-differential conversion circuit as a second embodiment of the present invention. The single-to-differential conversion circuit of FIG. 7 comprises NPN transistors 90 to 93.

In the NPN transistor 90, the emitter terminal is grounded, the base and the collector terminals are connected, and an input voltage of the single-to-differential conversion circuit of FIG. 7 is applied to the collector terminal. The emitter terminal of the NPN transistor 91 is grounded, the base terminal of the NPN transistor 91 is connected to the base terminal of the NPN transistor 90, and the collector terminal of the NPN transistor 91 is connected to the emitter terminal of the NPN transistor 93. The NPN transistor 90 and the NPN transistor 91 constitute a current mirror circuit.

The base terminal of the NPN transistor 92 is grounded, the emitter terminal of the NPN transistor 92 is connected to the collector terminal of the NPN transistor 90, and an output signal OUT+ of the single-to-differential conversion circuit of FIG. 7 is obtained from the collector terminal of the NPN transistor 92. The base terminal of the NPN transistor 93 is grounded, the emitter terminal of the NPN transistor 92 is connected to the collector terminal of the NPN transistor 91, and another output signal OUT– of the single-to-differential conversion circuit of FIG. 7 is obtained from the collector terminal of the NPN transistor 93.

The operations of the single-to-differential conversion circuit of FIG. 7 are explained below.

When a signal voltage is supplied to the collector terminal of the NPN transistor 90, a first collector current flows into the collector terminal of the NPN transistor 90 according to the voltage applied to the NPN transistor 90. On the other hand, a second collector current having a phase opposite to the phase of the first collector current flows into the NPN transistor 92, and corresponds to the output signal OUT+.

Since the NPN transistors 90 and 91 constitute a current mirror circuit, the amount of the current flowing into the collector terminal of the NPN transistor 90 is identical to the amount of the current flowing into the collector terminal of the NPN transistor 91. In addition, a voltage corresponding to the current flowing into the collector terminal of the NPN transistor 91 is applied between the collector and the emitter terminals of the NPN transistor 93, the amount of the current flowing into the collector terminal of the NPN transistor 93 is approximately identical to the amount of the current flowing into the collector terminal of the NPN transistor 91, and the current flowing into the collector terminal of the NPN transistor 93 corresponds to the output signal OUT−.

Further, since the voltage applied by the power supply to the collector terminal of the NPN transistor 93 is divided into the collector-emitter voltages of the NPN transistor 93 and the NPN transistor 91, the collector-emitter voltage of the NPN transistor 91 is close to the collector-emitter voltage of the NPN transistor 90. Therefore, the operating point of the NPN transistor 91 is close to the operating point of the NPN transistor 90, and the DC current levels of the output signals OUT+ and OUT− are equalized.

Thus, the single-to-differential conversion circuit as the second embodiment has the same advantages as the first embodiment.

Although the NPN transistors are used in the single-to-differential conversion circuit of FIG. 7, a similar single-to-differential conversion circuit can be constituted by using PNP transistors.

(4) Use of Second Embodiment

Figure 8:
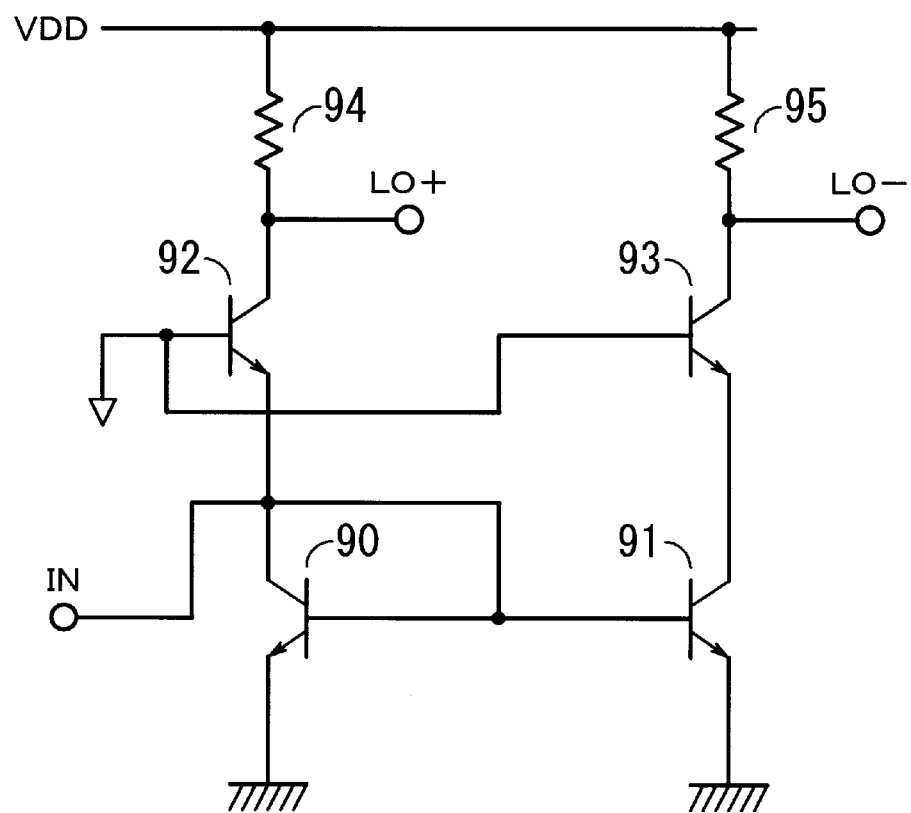
FIG. 8 is a diagram illustrating an example of an LO buffer using the single-to-differential conversion circuit as the second embodiment of the present invention.
Figure 9:
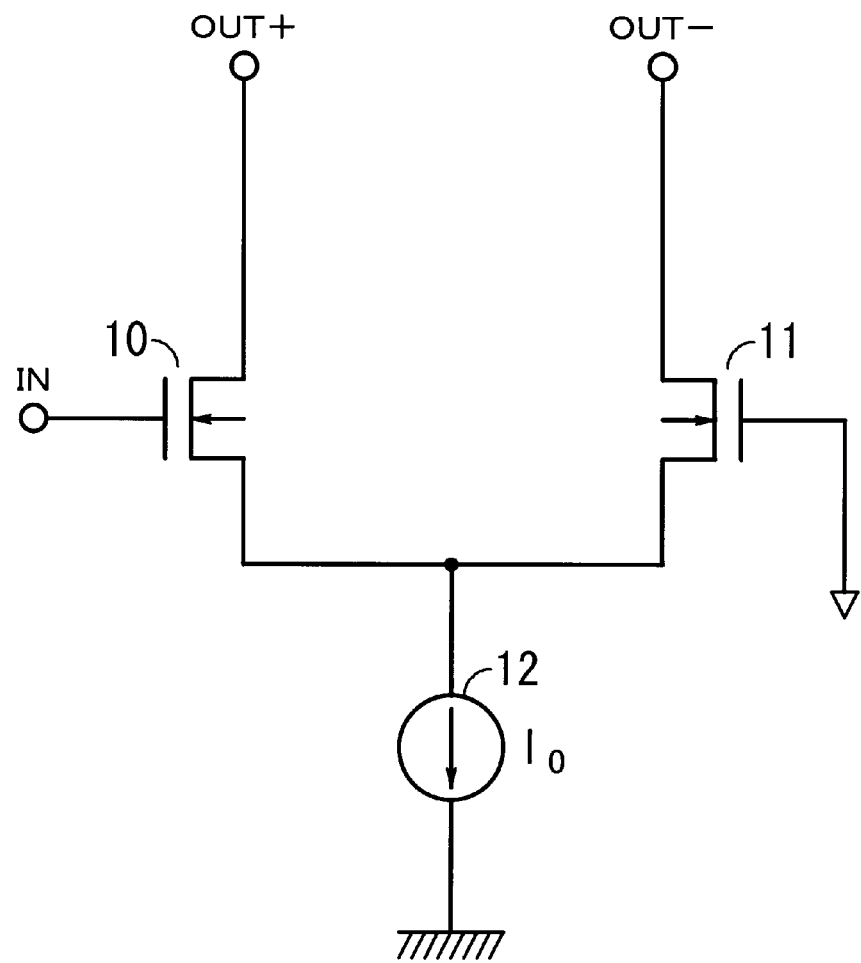
FIG. 9 is a diagram illustrating a first example of conventional single-to-differential conversion circuits.
Figure 10:
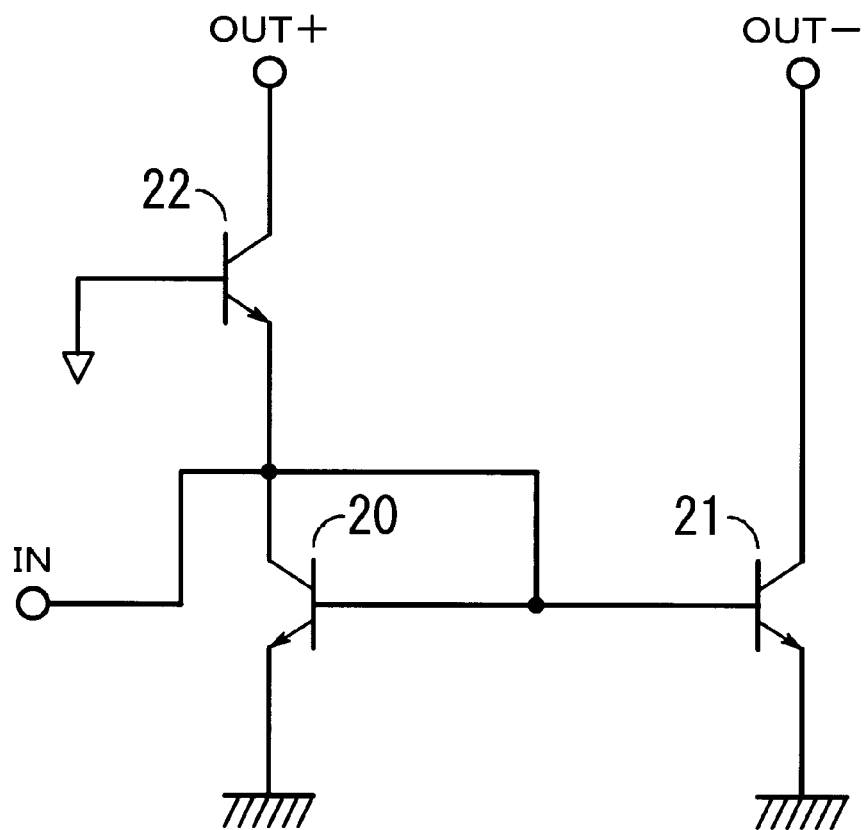
FIG. 10 is a diagram illustrating a second example of the conventional single-to-differential conversion circuits.

FIG. 8 is a diagram illustrating an example of an LO buffer using the single-to-differential conversion circuit as the second embodiment of the present invention. As illustrated in FIG. 8, the LO buffer of FIG. 8 comprises NPN transistors 90 to 93 and resistors 94 and 95.

The collector terminals of the NPN transistors 92 and 93 are connected to a power supply VDD through the resistors 94 and 95, respectively. In addition, the output signals LO+ and LO− of the LO buffer of FIG. 8 are obtained from the collector terminals of the NPN transistors 92 and 93, respectively.

Similar to the LO buffer 65 of FIG. 5, the operating points of the NPN transistors 90 and 91 in the single-to-differential conversion circuit of FIG. 8 come close to each other. Therefore, it is possible to prevent occurrence of imbalance in the DC current level between the output signals LO+ and LO−.

(5) Variations and Other Matters (i) The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

(ii) In addition, all of the contents of the Japanese patent application No. 2001-107533 are incorporated into this specification by reference.

What is claimed is:

1. A single-to-differential conversion circuit for converting a single signal into a differential signal formed of first and second signal components, comprising:

a first transistor which has a first drain terminal, a first gate terminal connected to the first drain terminal, and a grounded first source terminal, and receives said single signal at said first drain terminal;

a second transistor which has a second drain terminal, a second gate terminal connected to said first gate terminal, and a grounded second source terminal;

a third transistor which has a third drain terminal, a grounded third gate terminal, and a third source terminal connected to said first drain terminal, and outputs said first signal component from said third drain terminal; and a fourth transistor which has a fourth drain terminal, a grounded fourth gate terminal, and a fourth source terminal connected to said second drain terminal, and outputs said second signal component from said fourth drain terminal.

2. The single-to-differential conversion circuit according to claim 1, wherein said third drain terminal is connected to a power supply through a first resistor, said fourth drain terminal is connected to the power supply through a second resistor, said first signal component is a voltage signal which is generated by conversion from a current flowing into said third drain terminal, and said second signal component is a voltage signal which is generated by conversion from a current flowing into said fourth drain terminal.

3. A single-to-differential conversion circuit for converting a single signal into a differential signal formed of first and second signal components, comprising:

a first transistor which has a first collector terminal, a first base terminal connected to the first collector terminal, and a grounded first emitter terminal, and receives said single signal at said first collector terminal;

a second transistor which has a second collector terminal, a second base terminal connected to said first base terminal, and a grounded second emitter terminal;

a third transistor which has a third collector terminal, a grounded third base terminal, and a third emitter terminal connected to said first collector terminal, and outputs said first signal component from said third collector terminal; and a fourth transistor which has a fourth collector terminal, a grounded fourth base terminal, and a fourth emitter terminal connected to said second collector terminal, and outputs said second signal component from said fourth collector terminal.

4. The single-to-differential conversion circuit according to claim 3, wherein said third collector terminal is connected to a power supply through a first resistor, said fourth collector terminal is connected to the power supply through a second resistor, said first signal component is a voltage signal which is generated by conversion from a current flowing into said third collector terminal, and said second signal component is a voltage signal which is generated by conversion from a current flowing into said fourth collector terminal.

* * * * *